United States Patent
King et al.

[11] Patent Number: 6,121,101
[45] Date of Patent: Sep. 19, 2000

[54] PROCESS FOR FABRICATING BIPOLAR AND BICMOS DEVICES

[75] Inventors: Clifford Alan King, New York, N.Y.; Kwok K. Ng, Warren, N.J.

[73] Assignee: Lucent Technologies Inc., Murray Hill, N.J.

[21] Appl. No.: 09/042,388

[22] Filed: Mar. 12, 1998

[51] Int. Cl.$^7$ .................................................. H01L 21/331
[52] U.S. Cl. ........................... 438/309; 438/365; 438/341
[58] Field of Search ..................................... 438/309, 322, 438/323, 364, 365, 368, 202, 203, 234, 341; 257/565

[56] References Cited

U.S. PATENT DOCUMENTS

| | | | |
|---|---|---|---|
| 5,494,836 | 2/1996 | Imai | 438/365 |
| 5,599,723 | 2/1997 | Sato | 148/DIG. 10 |
| 5,620,908 | 4/1997 | Inoh et al. | 438/341 |
| 5,773,350 | 6/1998 | Herbert et al. | 438/341 |
| 5,895,248 | 4/1999 | De Boer et al. | 438/341 |

*Primary Examiner*—Tuan H. Nguyen
*Attorney, Agent, or Firm*—Richard J. Botos

[57] ABSTRACT

A process for device fabrication in which amorphous silicon is deposited into a narrow gap is disclosed. The gap is an opening between two layers of material. The gap results when a window is formed in one of the two layers and a portion of a third layer at the base of the window is removed. In the formation of a bipolar device, a layer of oxide is formed on a silicon substrate and a layer of silicon is formed on the oxide layer which serves as the extrinsic base for the device. In the bipolar device, a window is formed in the polysilicon and the oxide layer at the base of the window is then removed. In the bipolar device, the silicon substrate underlies the gap and the extrinsic base silicon overlies the gap. When the oxide is removed from the base of the window, a portion of the oxide layer underlying the extrinsic base silicon is removed as well, thereby forming a gap between the extrinsic base silicon and the underlying silicon substrate. In the process of the present invention, the resulting gap has a proximate end which is the opening of the gap into a window and a distal end which is the interface between the gap and the remaining oxide. The width of the gap is less than about 20 nm. The gap is then subjected to conditions that cause the gap to have a first height at its proximate end which is greater than its height at its distal end. The tapered gap is then filled with polysilicon. Because of its tapered configuration, the polysilicon uniformly fills the gap, without significant voids therein.

5 Claims, 5 Drawing Sheets

PROCESS FOR FABRICATING BIPOLAR AND BICMOS DEVICES

BACKGROUND OF THE INVENTION

1. Field of the Invention

The invention is directed to a process for semiconductor devices and in particular to processes for making bipolar and metal-oxide-semiconductor (MOS) devices (BiCMOS devices) on a single silicon substrate.

2. Art Background

Integrated circuits in which bipolar transistors are combined with CMOS devices are currently desired for high performance systems such as multi-GHz communication large scale integrated circuits. As noted by Kinoshita, Y., et al., "Process Integration Technology for sub-30ps ECL BiCMOS using Heavily Boron Doped Epitaxial Contact (HYDEC)" *IEDM*, 94:17.4, pp. 441–444 (1994), integrating the processes for making the bipolar devices and the CMOS devices. Kinoshita et al. note that attempts to integrate the processes for fabricating the two types of devices on a single substrate have caused several problems. These problems include: 1) poor gate oxide reliability caused by subsequent masking and etching steps to for removing the gate oxide from the bipolar regions; 2) pMOS subthreshold voltage ($V_t$) shift due to boron penetration during the thermal process sequence for bipolar graft base formation; and 3) enhancement of the short channel effect in pMOS caused by emitter drive-in thermal process.

To overcome these problems, Kinoshita et al. describe an integrated process for forming a bipolar device and an MOS device on a substrate. The integrate process utilizes a heavily doped epitaxial layer to both connect the base polysilicon electrode to the n-epi (collector) surface and as the diffusion source to form a bipolar graft base. The process described in Kinoshita is illustrated in the process flow sequence provided in FIG. 1. FIG. 1 illustrates the integrated steps for producing an MOS device and a bipolar device on a single substrate.

Referring to FIG. 1, in step 10 an n+ buried layer is formed in a silicon substrate. In step 20 a p+ buried layer is formed by high energy ion implantation followed by p-well and n-channel implantation. LOCOS (localized oxidation of silicon) isolation is performed in step 30, during which field oxide regions are formed on the silicon substrate. In step 40, the collector plug is formed by phosphorous ion implantation. N-well and p-channel implantations are performed in step 50, followed by the formation of a thin layer (7 nm thickness) of gate oxide, doped (boron for the bipolar device and either boron or arsenic or phosphorus for the MOS device) polysilicon (150 nm thickness) and silicon nitride layers (200 nm thickness) in step 60. The doped, polysilicon layer is the gate electrode of the MOS device and the base electrodes of the bipolar transistors.

In step 70 an emitter opening is formed and the gate oxide is removed from the bottom of the emitter opening using a wet etch. In this step a gap is formed under the undoped polysilicon layer. In step 80, heavily boron-doped epitaxial layer is then formed on the surface of the substrate using an ultra high vacuum chemical vapor deposition. In step 90, the heavily boron doped layer is selectively removed, leaving only that portion of the layer at the base of the emitter window. In step 100, a $BF_2$ ion implantation is used to form the intrinsic base, followed by a phosphorous implantation for forming the selective ion-implanted collector (SIC) and oxide spacer formation. In step 110 the bipolar base electrode and MOS gate are formed simultaneously. In step 120, a furnace anneal was performed for bipolar emitter and extrinsic base drive-in. This annealing step also activates the source/drain and gate electrodes of the nMOS device.

One of the disadvantages of the above-described process is that the gap underlying the undoped silicon layer is difficult to fill when the size of the gap is less than 200 nm using chemical vapor deposition, because of the gaps that form in the fill as the fill material builds up on the bottom and top of the gap. Current CMOS technology requires gate oxide thicknesses of about 1.5 nm to about 6 nm. Since the gap results from the removal of the gate oxide, gap sizes are also in the range of about 1.5 nm to about 6 nm. As previously noted, gaps of this size are difficult to fill uniformly. Because a less than completely filled gap will cause problems in device performance, a process in which these gaps are completely filled in is desired.

SUMMARY OF THE INVENTION

The present invention is directed to a process for device fabrication in which a gap is formed between two layers which are no more than 200 nm apart and then subsequently filled. Specifically, in an integrated process for simultaneously forming at least one bipolar transistor and at least one CMOS device a thin gate oxide layer, (i.e. an oxide layer with a thickness of 200 nm or less) is formed on regions of the substrate that will become the gate of the CMOS device and the intrinsic base of the bipolar device. The fabrication of the bipolar device requires the removal of the gate oxide under the extrinsic base region in order to fabricate the extrinsic base.

In the process of the present invention, the gate oxide under the extrinsic base is removed after the emitter opening is formed in the extrinsic base silicon. The process steps are performed in this sequence in order to obtain a desirable and efficient integration of the process for fabricating the CMOS device and the process for fabricating the bipolar device. When the gate oxide is removed a gap is formed under the extrinsic base silicon (typically the extrinsic base silicon is amorphous when the gap is formed and refilled and, afterwards, the amorphous silicon is annealed to form polysilicon, for convenience herein, this silicon layer is referred to as the extrinsic base silicon) which is subsequently refilled with doped silicon.

In the process of the present invention, the gap is formed not only by removing the gate oxide underlying the extrinsic base silicon, but by etching a portion of the underlying silicon and the overlying extrinsic base silicon in a manner that provides a gap wherein the distance between the underlying silicon and the overlying extrinsic base silicon is greater at the gap opening into the emitter opening than at the end of the gap adjacent to the remaining gate oxide. For convenience, the gap opening is referred to as the proximate end of the gap and the gap end is referred to as the distal end of the gap. Typically, the distance between the underlying silicon and the overlying extrinsic base silicon is equal to the thickness of the gate oxide at the distal end of the gap and greater than the thickness of the gate oxide at the proximate end of the gap. Therefore, after the gate oxide is removed and the gap is formed, the underlying silicon and the overlying extrinsic base silicon are subjected to conditions that cause their removal at the proximate end of the gap at a rate faster than their rate of removal at the distal end of the gap.

In one embodiment of the present invention, the gap is subjected to conditions that cause the underlying silicon and the overlying extrinsic base silicon to oxidize. Because of the nature of the gap, the underlying silicon and the overlying extrinsic base silicon at the proximate end of the gap oxidize at a faster rate than the overlying extrinsic base silicon and the underlying silicon at the distal end of the gap. Conventional expedients are employed to achieve the desired taper in the gap. It is advantageous if the gap is subjected to conditions that oxidize the overlying polysilicon and underlying silicon. A combination of conventional oxidation expedients such as controlled furnace oxidation, chemical oxidation, or by subjecting the gap to an oxygen containing atmosphere at ambient temperature are contemplated as suitable. After the oxide is formed, it is removed using conventional expedients for the removal of oxide such as an aqueous solution of hydrofluoric acid.

It is advantageous if expedients are employed to produce a tapered gap. As used herein a tapered gap is one in which the distance between the overlying extrinsic base silicon and the underlying base silicon changes gradually from the first distance at the proximate end to the gap to the second distance at the distal end of the gap. In this embodiment, the gap is subjected to the conditions for a sufficient amount of time to achieve the desired configuration.

The desired degree of taper is a function of the thickness of the gate oxide layer that was removed to form the gap. It is advantageous if, after the gap is formed, it is subjected to conditions that provide a first distance at the proximate end of the gap that is at least ten percent greater than the second distance at the distal end of the gap. The resulting gap is then refilled with polysilicon using a conventional technique such as low pressure chemical vapor deposition. Low pressure chemical vapor deposition is easier and less expensive than the deposition of amorphous silicon using ultra high vacuum.

DETAILED DESCRIPTION

Figure 1:
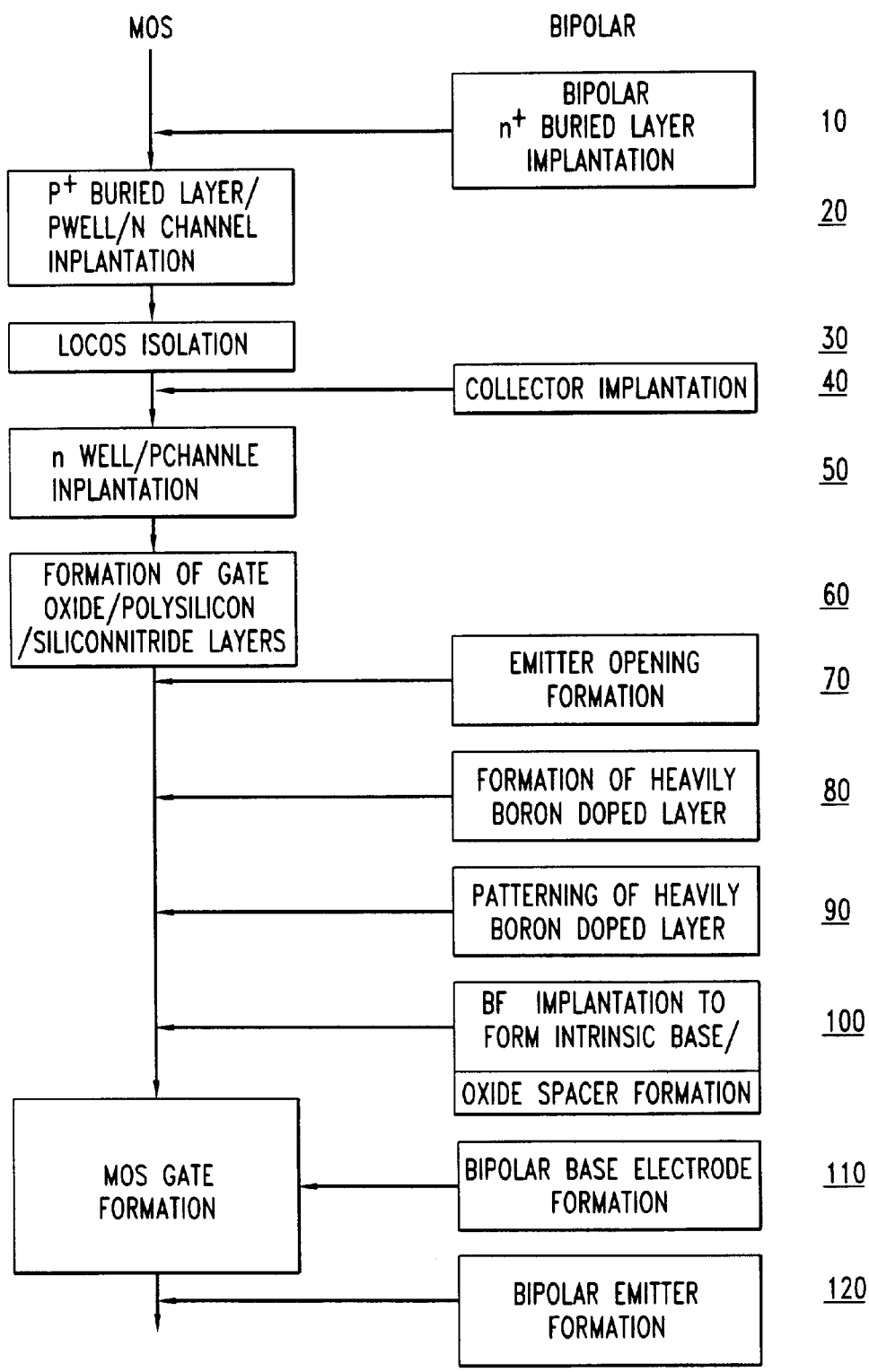
FIG. 1 is a flow diagram of certain steps in the prior art fabrication process of a BiCMOS device.
Figure 2:
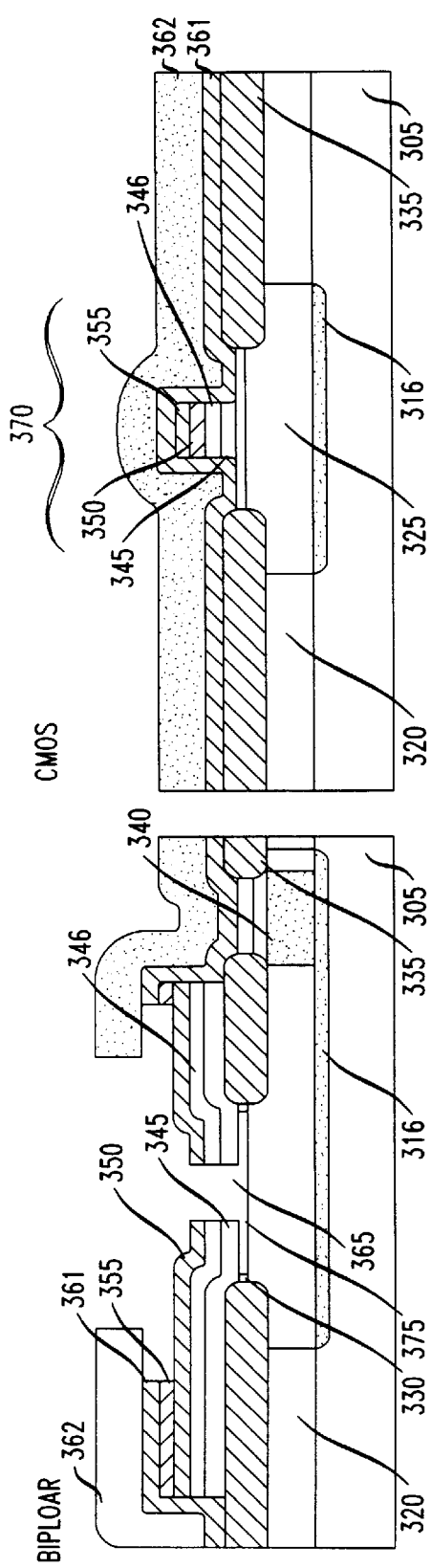
FIG. 2 is a side view of a substrate on which a BiCMOS device is being fabricated at the point in the process where the gate oxide underlying the emitter opening has been removed and a gap underlying the extrinsic base silicon has been formed.
Figure 3:
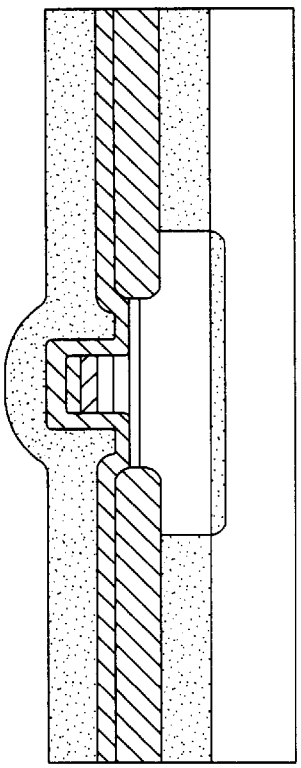
FIG. 3 is a side view of a substrate after the width of the gap underlying the extrinsic base silicon has been widened and tapered according to the process of the present invention.
Figure 3:
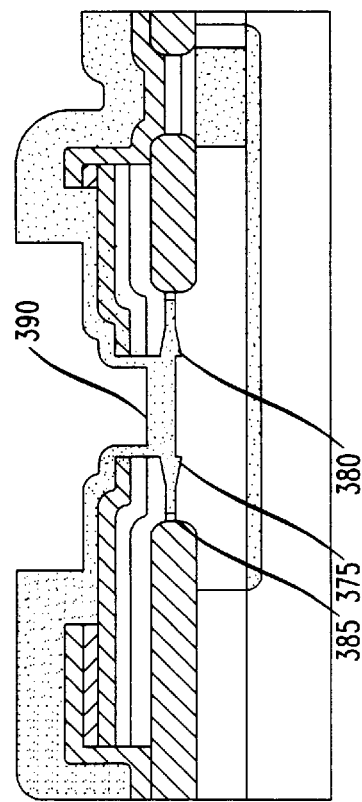

FIG. 2 illustrates a substrate 305 on which a bipolar device 310 and a CMOS device 315 are being simultaneously formed. A buried layer region 316 is formed in the substrate 305 by ion implantation followed by an oxidation step to drive the dopants into the substrate 305. N-well regions 325, p-well region 320, and field oxide region 335 are formed on the substrate 305. A reach through implant (also referred to as a sinker) 340 is also formed in the substrate 305. A gate oxide 330 is formed on the substrate 305. The gate oxide has a thickness in the range of about 2 nm to about 20 nm. For CMOS devices made according to 0.25 um device rules, the thickness of the gate oxide is about 4.5 nm. For CMOS devices made according to 0.18 um device rules, the thickness of the gate oxide is about 2.5 nm.

Layers of polysilicon 345, tungsten silicide 346, silicon nitride 350, plasma enhanced tetraethylorthosilicate (PETEOS) 355 and an antireflective coating (not shown) were sequentially formed on the substrate 305. The emitter opening 365 and the gate 370 were defined simultaneously by selective removal of portions of layers 345, 346, 350, and 355. The remaining anti-reflective coating is then removed.

Layers of PETEOS 361 and a polysilicon hardmask 362 were then deposited and patterned. The substrate was then subjected to conditions that removed the gate oxide 330 from the bottom of the emitter opening 365. A portion of the gate oxide 330 underlying the polysilicon is 345 is also removed by this step to form the gap 375.

The structure illustrated in FIG. 2 was then subjected to conditions that oxidize the regions adjacent to the gap 375. Suitable expedients include exposing the gap 375 to an oxygen-containing atmosphere such as ambient air for a period of time that is sufficient to oxidize a portion of the extrinsic base silicon and the underlying silicon to the desired extent. Suitable conditions are capable of wide variation depending upon the desired degree of oxidation. If the extrinsic base silicon and the underlying silicon are oxidized in ambient air (i.e. air at a temperature of about 30° C.) the time required to obtain the desired degree of oxidation could vary from about 24 hours to about 30 days. One skilled in the art will appreciate that a variety of expedients are employed to achieve the desired objective, and that by elevating the temperature, one can obtain the desired degree of oxidation in a shorter period of time. The desired objective is also achieved if a series of oxidation/etch steps are used.

The objective of this step is to introduce a tapered gap that is wider at its proximate end 380 than it is at its distal end 385. In order to achieve this objective, the gap is subjected to the oxidation expedient for a time sufficient to increase the gap height 375 at its proximate end 380 by at least about ten percent over the gap height at the distal end 385.

After the tapered gap 375 is formed, polysilicon 390 is deposited over the surface of the substrate 305. Because of the tapered gap 375, the polysilicon 390 does not have gaps therein which could adversely affect the contact between the extrinsic base and the intrinsic base and the bipolar device 310.

EXAMPLE 1

Following the process sequence described above, there was formed an emitter opening with a 20 nm thick layer of oxide at the base thereof. The gate oxide in the emitter opening was removed using a 100:1 solution of aqueous HF for 70 minutes. The substrate was then rinsed and dried using conventional expedients. The substrate was then stored in ambient air for about 24 hours. The gap was then filled with polysilicon using a low pressure chemical vapor deposition system (LPCVD). The LPCVD tool was obtained from SemiTherm of Kalispell, Mont. The tool was designed to perform vertically oriented low pressure chemical vapor deposition. The deposition occurred at a temperature of 550° C., a pressure of 250 mTorr, and with a silane flow of about 40 sccm through a first (top) injector and about 70 sccm through a second (bottom) injector. The growth rate of the polysilicon was about 2 nm/minute.

Figure 4:
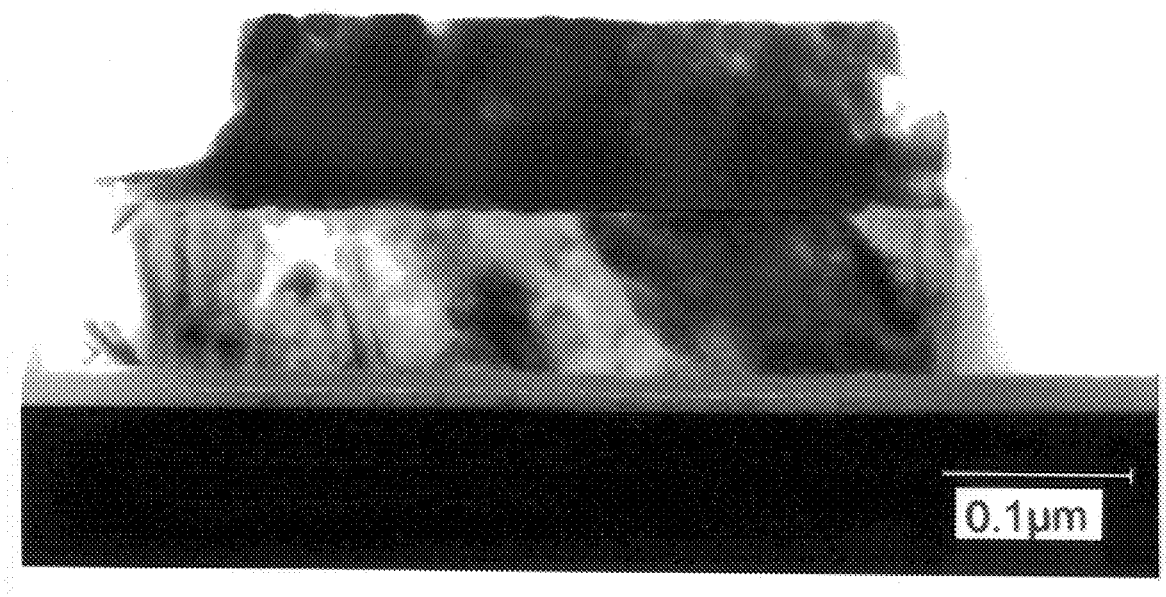
FIG. 4 is a side view of an untapered 20 nm gap refilled with epitaxial silicon and the gaps therein.

The resulting structure was subjected to a TEM (tunneling electron microscope) analysis. As illustrated by the Photograph in FIG. 4, the gap height is essentially constant from the proximate end to the distal end of the gap. Furthermore, the gap is not uniformly filled with the polysilicon, as evidenced by the light regions in the approximated center of the layer of polysilicon.

By comparison, there was formed an emitter opening with a 6 nm thick layer of oxide at the base thereof. The gate oxide in the emitter opening was removed using a 100:1 solution of aqueous HF for 70 minutes. The substrate was then rinsed and dried using conventional expedients. The substrate was then stored in ambient air for about 24 hours. The oxide was then removed using a 100:1 solution of aqueous HF for 1 minute. The gap was then filled with polysilicon using a low pressure chemical vapor deposition system using the previously described tools and conditions.

Figure 5:
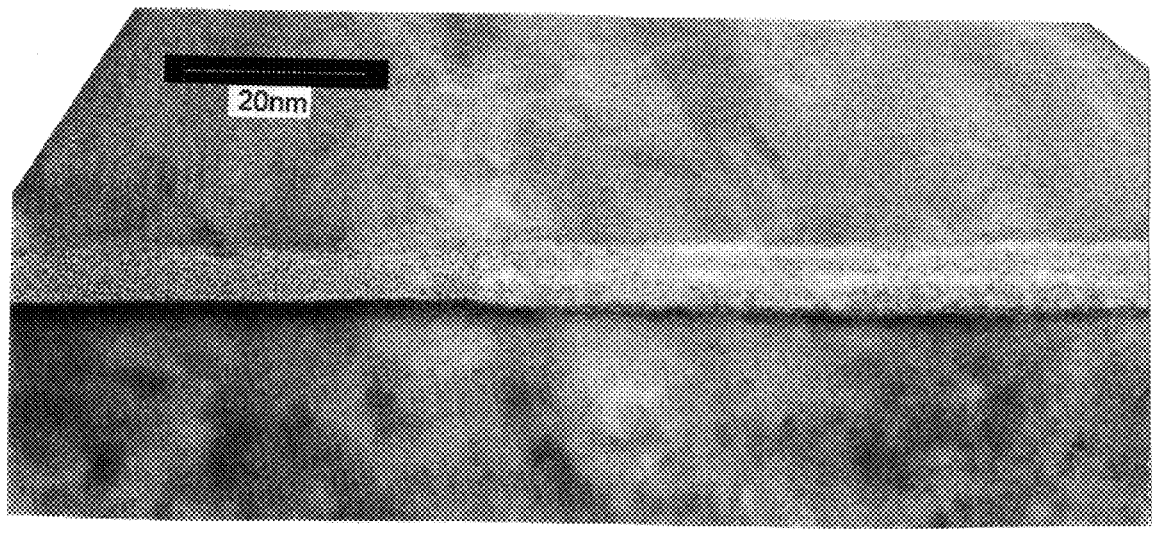
FIG. 5 is a side view of a tapered 6 nm refilled with epitaxial silicon.

The resulting structure was subjected to a TEM (tunneling electron microscope) analysis. As illustrated by the Photograph in FIG. 5, the gap height has a different height at the proximate end thereof than at the distal end thereof. The height of the gap at the proximate end is clearly greater than the height of the gap at the distal end. Furthermore, there are no light regions in the layer of polysilicon so formed, which indicates that the polysilicon uniformly filled the gap.

The above-described results indicate that the conditions required to provide a gap having a height that tapers from a larger height at the proximate end of the gap to a smaller height at the distal end of the gap will vary depending upon the thickness of the oxide. Conditions that provided a gap with the desired taper when the oxide had a thickness of 6 nm did not provide a gap with the desired taper when the thickness of the oxide was about 20 nm.

EXAMPLE 2

Following the process sequence described above, there was formed an emitter opening with a 2.5 nm thick layer of oxide at the base thereof. The gate oxide in the emitter opening was removed using a 100:1 solution of aqueous HF for 70 minutes. The lateral etch of the oxide proceeded about 60 nm under the polysilicon. The substrate was then rinsed and dried using conventional expedients. The substrate was then stored in ambient air for about 30 days. An aqueous HF solution (100:1) was used to remove the oxide. The gap was then filled with polysilicon using a low pressure chemical vapor deposition system as described in the previous example.

Figure 6:
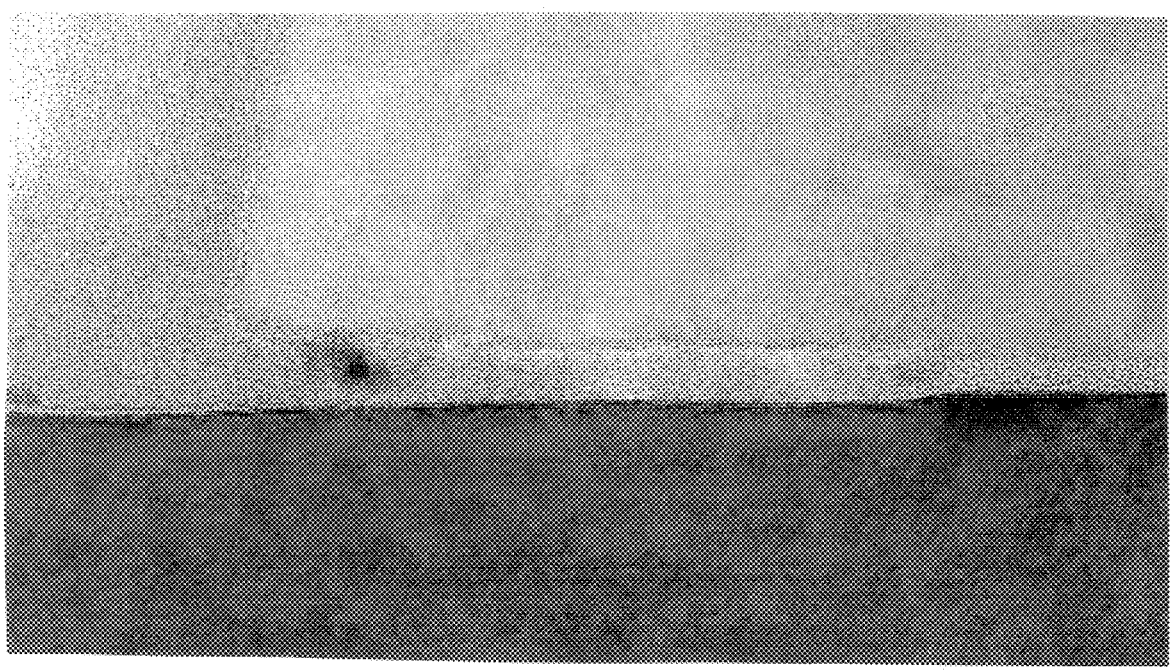
FIG. 6 is a side view of a tapered 2.5 nm gap refilled with epitaxial silicon.

The resulting structure was subjected to a TEM (tunneling electron microscope) analysis. As illustrated by the Photograph in FIG. 6, the gap height is greater at the proximate end of the gap than at the distal end of the gap. The gap height also changes gradually from the proximate end to the distal end of the gap. Furthermore, the gap is uniformly filled with the polysilicon, as evidenced by the uniform appearance of the layer of polysilicon.

What is claimed is:

1. A process for device fabrication comprising:

forming a first layer of a first material onto a silicon substrate, wherein the first layer has a thickness of less than about 10 nm;

forming a second layer of a second material over the first layer;

forming a window in the second layer of material which terminates at the first layer;

removing the portion of the first layer of material at the base of the window, and at least a portion of the first layer underlying the second layer thereby forming a gap between the second layer and the underlying substrate wherein the gap has a proximate end and a distal end wherein the proximate end is the end of the gap adjacent the window and the distal end is the end of the gap adjacent the remaining portion of the first layer and wherein the gap has a height which is defined as the distance between the overlying second layer and the underlying substrate;

subjecting the gap to conditions that cause the gap height to be at least ten percent greater at the proximate end of the gap than at the distal end of the gap; and refilling the gap with a material by chemical vapor deposition.

2. The process of claim 1 wherein the first layer of material is silicon dioxide and the second layer of material is polycrystalline silicon.

3. The process of claim 2 wherein the gap is refilled with amorphous silicon by low pressure chemical vapor deposition.

4. The process of claim 3 wherein the gap is exposed to an oxygen containing atmosphere for a time sufficient of oxidize at least a portion of the polycrystalline silicon adjacent to the gap.

5. The process of claim 4 wherein the oxidized polycrystalline silicon is removed using a chemical etchant thereby forming the gap with a height at proximate end that is at least ten percent greater than the gap height at the distal end.

* * * * *